(12) United States Patent
Ohira et al.

(10) Patent No.: US 9,740,260 B2
(45) Date of Patent: Aug. 22, 2017

(54) ELECTRONIC CONTROL APPARATUS

(71) Applicant: DENSO CORPORATION, Kariya, Aichi-pref. (JP)

(72) Inventors: Megumi Ohira, Kariya (JP); Fumihiko Nakane, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/173,776

(22) Filed: Jun. 6, 2016

(65) Prior Publication Data

US 2016/0363981 A1  Dec. 15, 2016

(30) Foreign Application Priority Data

Jun. 10, 2015 (JP) .................................. 2015-117379

(51) Int. Cl.
| | |
|---|---|
| *H03K 3/00* | (2006.01) |
| *G06F 1/28* | (2006.01) |
| *H03K 7/08* | (2006.01) |
| *G06F 1/06* | (2006.01) |
| *F02D 41/20* | (2006.01) |
| *F02D 41/24* | (2006.01) |
| *F02D 41/28* | (2006.01) |

(52) U.S. Cl.
CPC .............. *G06F 1/28* (2013.01); *F02D 41/20* (2013.01); *F02D 41/2467* (2013.01); *G06F 1/06* (2013.01); *H03K 7/08* (2013.01); *F02D 2041/2027* (2013.01); *F02D 2041/2058* (2013.01); *F02D 2041/286* (2013.01); *F02D 2250/14* (2013.01); *H03F 2200/261* (2013.01); *H03F 2200/462* (2013.01); *H03F 2200/78* (2013.01)

(58) Field of Classification Search
None
See application file for complete search history.

(56) References Cited

U.S. PATENT DOCUMENTS

| | | | |
|---|---|---|---|
| 6,687,555 B1 | 2/2004 | Honda et al. | |
| 2006/0092068 A1 | 5/2006 | Ko et al. | |
| 2014/0375290 A1* | 12/2014 | Mizuno | H02M 3/156 323/282 |
| 2015/0088320 A1* | 3/2015 | Mizuno | H02J 1/06 700/282 |

FOREIGN PATENT DOCUMENTS

JP  2014-96409 A  5/2014

* cited by examiner

*Primary Examiner* — Long Nguyen
(74) *Attorney, Agent, or Firm* — Posz Law Group, PLC (57) ABSTRACT

An electronic control apparatus that controls actuation of an inductive load includes: a current detector that detect current flowing through the inductive load and outputs a current detection signal in an analog signal; an analog-digital converter that takes in the current detection signal at a fetch timing, and converts the current detection signal into a current detection value; and a controller that calculates a current arithmetic value by executing arithmetic processing for the current detection value, and controls the current based on the current arithmetic value. The controller obtains a sample data value of the current arithmetic value for each of a plurality of fetch timings. The controller calculates a deflection between an ideal value of the current arithmetic value and the sample data value of the current arithmetic value, and learns the fetch timing, causing the deflection with the ideal value of the current arithmetic value to be minimized.

7 Claims, 8 Drawing Sheets

| FETCH START TIMING ts | SAMPLE VALUE OF AVE CURR VALUE Iave |
|---|---|
| ts(1) | Is(1) |
| ts(2) | Is(2) |
| ⋮ | ⋮ |
| ts(m) | Is(m) |
| ts(m+1) | Is(m+1) |
| ⋮ | ⋮ |
| ts(n) | Is(n) |

| DUTY RATIO D [%] | LEARNING VALUE OF FETCH START TIMING ts |
|---|---|
| $D1 < D \leq D2$ | $ts(a)$ |
| $D2 < D \leq D3$ | $ts(b)$ |
| $D3 < D \leq D4$ | $ts(c)$ |
| ⋮ | ⋮ |

ELECTRONIC CONTROL APPARATUS

CROSS REFERENCE TO RELATED APPLICATION

This application is based on Japanese Patent Application No. 2015-117379 filed on Jun. 10, 2015, the disclosure of which is incorporated herein by reference.

TECHNICAL FIELD

The present disclosure relates to an electronic control apparatus that controls an actuation of an inductive load.

BACKGROUND

Patent literature 1: JP H11-308107 A (corresponding to U.S. Pat. No. 6,687,555 B1)

In an inductive load such as an electromagnetic valve (also referred to as a solenoid valve), an electromagnetic actuator, a linear solenoid is used as power source. An electronic control apparatus controls an actuation (a drive) of the inductive load. The electronic control apparatus controls current supplied to the linear solenoid, and thus controls the actuation of the inductive load. This kind of an electronic control apparatus includes apparatus described in Patent literature 1.

The electronic control apparatus described in Patent literature 1 includes a FET (a field effect transistor), an A/D converter (an analog-digital converter), and a control CPU. The FET is placed between the inductive load and a power source. The A/D converter converts a current detection signal of a linear solenoid into a digital signal from an analog signal. The control CPU detects a current value flowing through the linear solenoid based on the current detecting signal converted into the digital signal. The control CPU performs a feedback control of a supply current of the linear solenoid, so that an average value of the detected current value is equal to a target current value. Specifically, the control CPU sets a duty ratio based on a deflection between the average value of the detected current value and the target current value, and generates a PWM (pulse-width modulation) signal according to the duty ratio. The control CPU causes the FET to turn on and off according to the PWM signal, and performs a PWM control of the supply current of the linear solenoid. The control CPU controls the actuation of the inductive load through such a current feedback control.

The inventors of the present application have found the following. In order to improve accuracy of the drive control of the inductive load in the electronic control apparatus of Patent literature 1, the average value of the detection current value may be detected precisely. In order to detect the average value of the detection current value with a sufficient precision, it may be considered that the sampling number of the detection current value is increased, for example. When the sampling numbers of the detection current value is increased, processing load of the control CPU may increase. The sampling number of the detection current value represents the number of times of sampling of the detection current value. Especially in a control CPU without a hardware IP, all the arithmetic concerning the detection current value may have to in a software manner. An effect to the processing load on the control CPU may increase.

SUMMARY

It is an object of the present disclosure to provide an electronic control apparatus that can assure accuracy of a current control of an inductive load while reducing a processing load on a controller.

According to one example of the present disclosure, an electronic control apparatus that controls actuation of an inductive load is provided. The electronic control apparatus includes a current detector, an analog-digital converter, and a controller. The current detector detects current flowing through the inductive load and outputs a current detection signal according to a value of the current, which is detected, in an analog signal. The analog-digital converter takes in the current detection signal from the current detector at a predetermined fetch timing, and converts the current detection signal into a current detection value of a digital value from the analog signal. The controller calculates a current arithmetic value by executing a predetermined arithmetic processing for the current detection value converted by the analog-digital converter, and controls the current flowing through the inductive load based on the current arithmetic value. The controller, by obtaining the current arithmetic value while changing the fetch timing, obtains a sample data value of the current arithmetic value for each of a plurality of fetch timings. The controller calculates a deflection between an ideal value of the current arithmetic value and the sample data value of the current arithmetic value for each of the plurality of fetch timings, and learns the fetch timing of the analog-digital converter, causing the deflection with the ideal value of the current arithmetic value to be minimized.

According to this configuration, even when the number of times of sampling of the current detection value of the A/D converter is reduced so as to reduce the processing load on the controller, it may be possible to assure an operational accuracy of the current arithmetic value by learning a fetch timing. Therefore, while reducing the processing load on the controller, it may be possible to assure accuracy of the current control of the inductive load.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

An embodiment of an electronic control apparatus will be explained.

Figure 1:
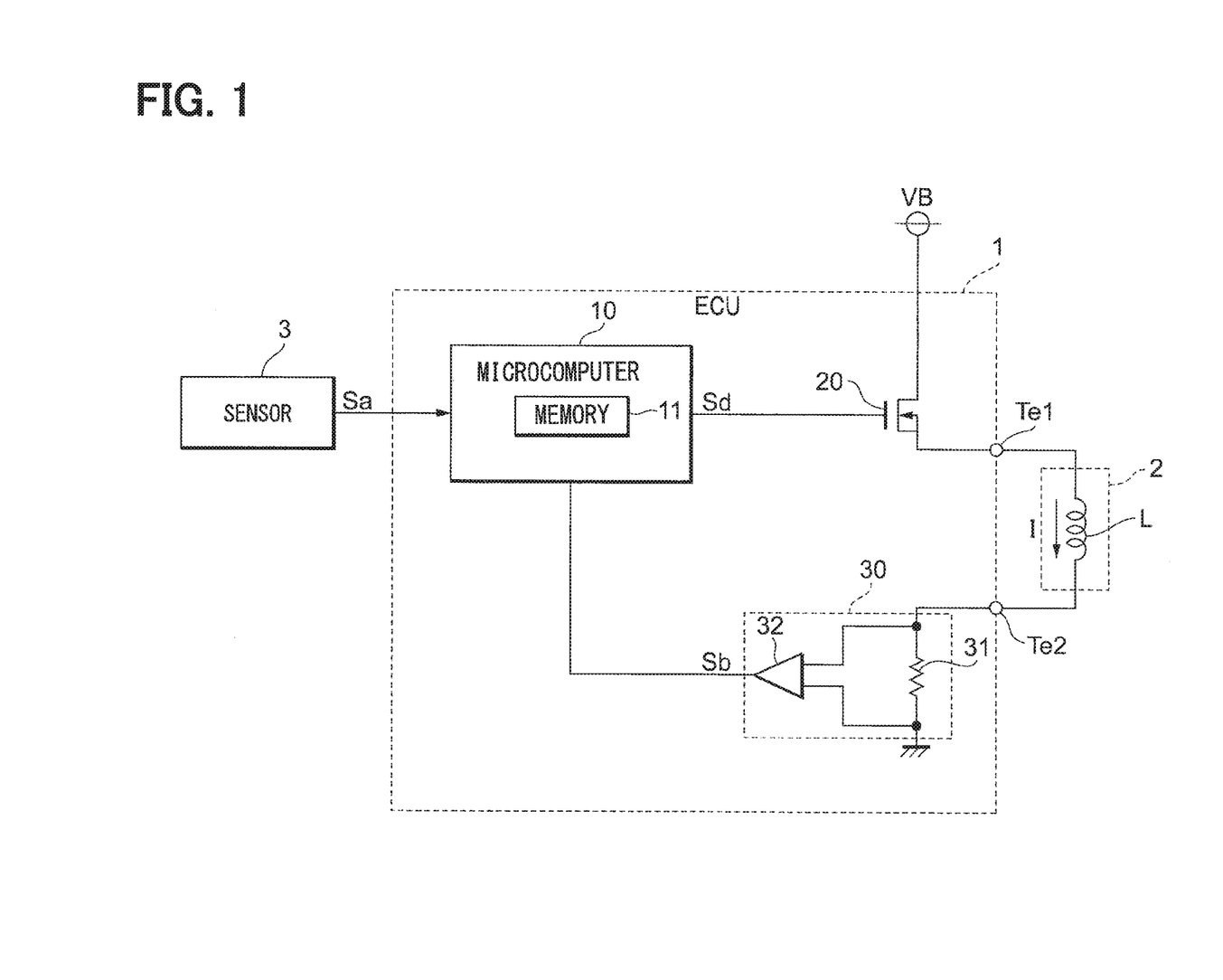
FIG. 1 is a block diagram illustrating an overall configuration of an embodiment of an electronic control apparatus of the present disclosure.

As described in FIG. 1, an electronic control apparatus 1 of the present embodiment controls actuation (also referred to as drive) of an inductive load 2. The inductive load 2 is a device such as a hydraulic valve for gearhead mounted in a vehicle, and has a linear solenoid L as a power source. The electronic control apparatus 1 includes a microcomputer 10, a semiconductor switch 20, and a current detection portion 30. Hereinafter, the electronic control apparatus 1 may be referred to as an ECU (electronic control unit) 1. In the present embodiment, the microcomputer 10 corresponds to a controller. The current detection portion corresponds to an example of a current detector.

The semiconductor switch 20 includes an n-channel type MOS-FET (metal-oxide-semiconductor field-effect transistor). A source voltage VB is applied to a source terminal of the semiconductor switch 20. A drain terminal of the semiconductor switch 20 is connected to one end part (a first end part) of the linear solenoid L through a terminal Te1 of ECU 1. The other end part (a second end part) of the linear solenoid L is connected to a ground potential through a terminal Te2 of the ECU 1 and a resistance 31.

The current detection portion 30 includes a resistance 31 and a differential amplifier circuit 32. The differential amplifier circuit 32 differentially amplifies the voltage between both terminals of the resistance 31, and outputs the voltage as a current detection signal Sb. The current detection signals Sb is an analog signal which has a correlation with a current flowing through the resistance 31. The current flowing through the resistance 31 corresponds to an actual current value I which flows through the linear solenoid L. The current detection portion 30 detects the actual current value I flowing through the inductive load 2, and outputs the current detection signal Sb according to the detected actual current value I as the analog signal.

The microcomputer 10 includes a CPU (not shown), a memory 11 (being an example of a non-transitory computer readable medium), or the like. The microcomputer 10 receives a signal outputted from a sensor 3 and the current detection signal Sb outputted from the current detection portion 30. The sensor 3 is mounted to a vehicle. The sensor 3 outputs a vehicle state quantity detection signal Sa according to the detected vehicle state quantity while detecting a vehicle state quantity required in order to control the actuation of the inductive load 2. The microcomputer 10 generates a PWM drive signal Sd based on the vehicle state quantity detection signal Sa outputted from the sensor 3 and on the current detection signal Sb outputted from the current detection portion 30. The microcomputer 10 inputs the PWM drive signal Sd to a gate terminal of the semiconductor switch 20, causing the semiconductor switch 20 to turn on and off. Accordingly, the microcomputer 10 performs a PWM control of the actual current value I flowing through the linear solenoid L, and thus controls the drive of the inductive load 2.

The microcomputer 10 executes a current control of the inductive load 2. The current control of the inductive load 2 will be explained in detail.

Figure 2:
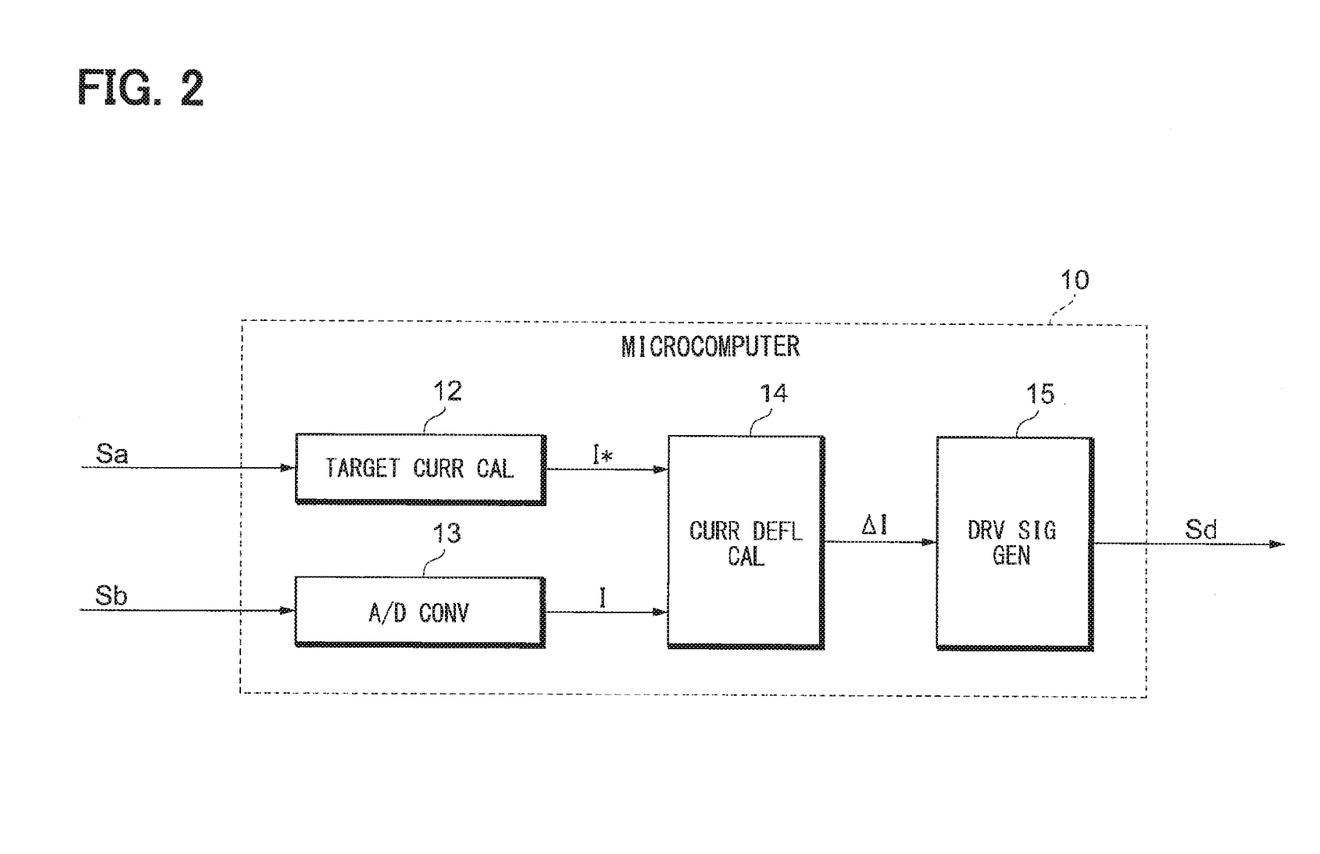
FIG. 2 is a block diagram illustrating an overall configuration of a microcomputer of the electronic control apparatus of the present embodiment.

As described in FIG. 2, the microcomputer 10 includes a target current value calculation portion 12, an A/D converter 13, a current value deflection calculation portion 14, and a drive signal generation portion 15. Incidentally, the A/D converter represents an analog-digital converter. The target current value calculation portion 12 corresponds to an example of a target current value calculator. The current value deflection calculation portion 14 corresponds to an example of a current value deflection calculator. The drive signal generation portion 15 corresponds to an example of a drive signal generator.

The target current value calculation portion 12 detects the vehicle state quantity based on the vehicle state quantity detection signal Sa of the sensor 3. The target current value calculation portion 12 calculates a target current value I* based on the vehicle state quantity. The target current value I* is a target value of current that should be flowed through the linear solenoid L. The target current value calculation portion 12 calculates the target current value I* from the vehicle state quantity, based on a map, an arithmetic expression or the like, which illustrate the connection between a vehicle state quantity and target current value I*. The target current value calculation portion 12 outputs the calculated target current value I* to the current value deflection calculation portion 14.

The A/D converter 13 converts the current detection signal Sb into a digital value from an analog signal. Thus, the A/D converter 13 outputs the current detection value I, which is converted into the digital value, to the current value deflection calculation portion 14.

The current value deflection calculation portion 14 performs the following arithmetic processing for the current detection value I. That is, the current value deflection calculation portion 14 performs an equalization processing which calculates an average value Iave of the current detection value I, and also calculates a deflection ΔI between the average Iave and the target current value I*. Hereinafter, the average value Iave of the current detection value I may be referred to as an average current value Iave. In the present embodiment, the average current value Iave corresponds to a current arithmetic value. The current value deflection calculation portion 14 outputs the current deflection ΔI to the drive signal generation portion 15.

The drive signal generation portion 15 executes a current feedback control, in which the average current value Iave is caused to follow the target current value I* based on the current deflection ΔI. The drive signal generation portion 15 calculates a duty ratio. The drive signal generation portion 15 generates the PWM drive signal Sd by which a pulse width modulation has been performed according to the duty ratio. The PWM drive signal Sd includes a pulse signal in which the ratio of the ON time occupied in one cycle is set as the duty ratio. The drive signal generation portion 15 inputs the PWM drive signal Sd to the gate terminal of the semiconductor switch 20, causing the semiconductor switch 20 to turn on and off. Thus, the drive signal generation portion 15 performs the PWM control of the actual current value I flowing through the linear solenoid L.

In order to improve accuracy of the drive control of the inductive load 2 in the microcomputer 10, it may be necessary to detect the average current value Iave with sufficient precision. In order to detect the average current value Iave with sufficient precision, it may be considered that the sampling number (the number of times of sampling) of the detection current value is increased, for example. However, a processing load on the control CPU may increase when the sampling numbers of the current detection value I is increased.

The microcomputer 10 of the present embodiment learns a fetch timing of the current detection signal Sb by changing the fetch timing of the current detection signal Sb in the A/D converter 13. Accordingly, the precision of the current control of the inductive load 2 is assured while reducing the number of time of sampling of the current detection value I of the A/D converter 13. Incidentally, the fetch timing may represent timing when the A/D converter 13 takes in the current detection signal Sb, for example.

The learning processing of the fetch timing of the current detection signal Sb with the microcomputer 10 will be explained.

The microcomputer 10 obtains an ideal value Ii of the average current value Iave and sample data values Is(1)-Is(n) of multiple average current value Iave, in advance of execution of the current control of the inductive load 2. Incidentally, "n" represents two or more integers. An acquisition method of the ideal value Ii of the average current value Iave with the microcomputer 10 will be explained.

Figure 3:
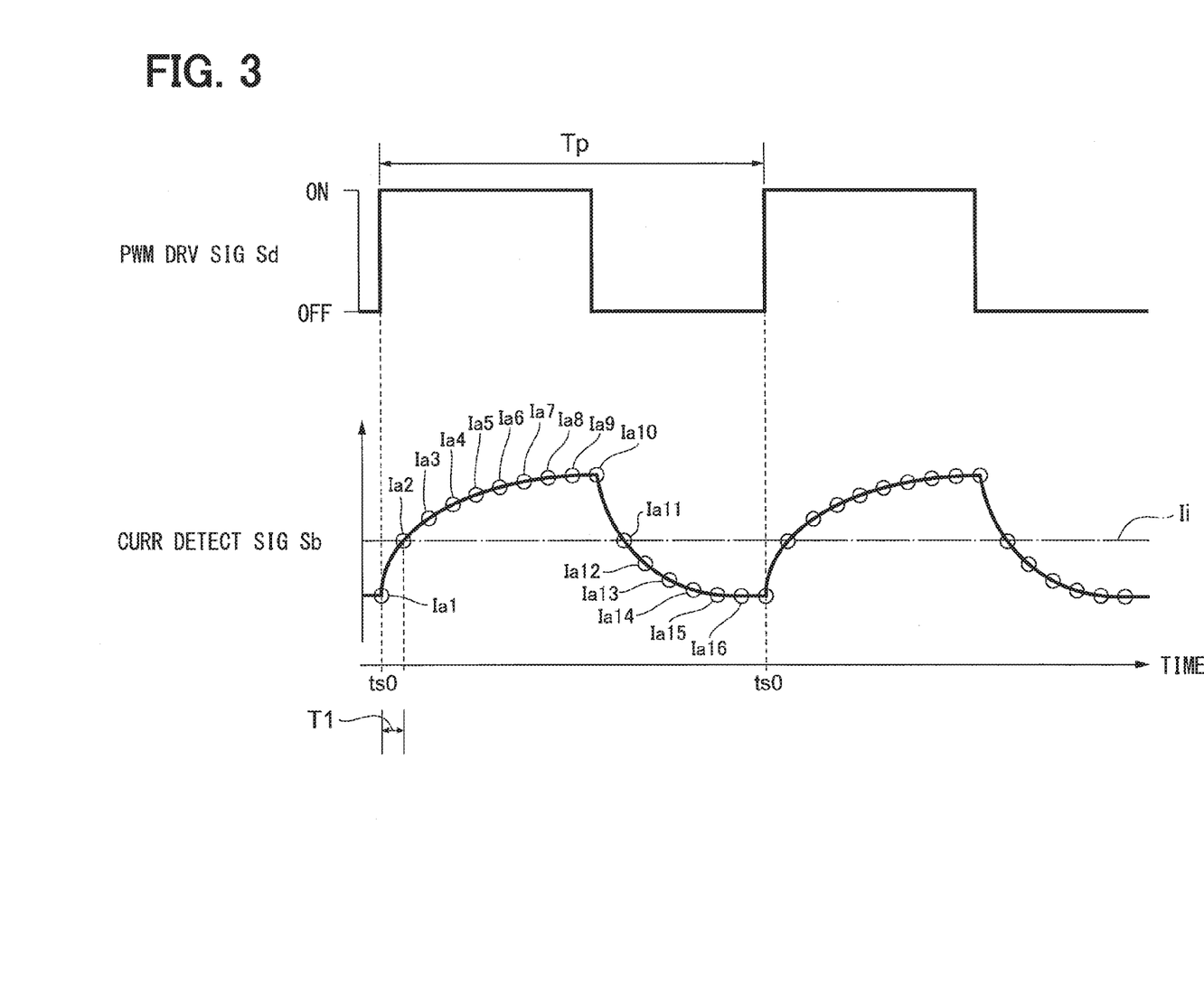
FIG. 3 is a timing chart illustrating changes of a PWM drive signal Sd and a current detection signal Sb.

For example, when the PWM drive signal Sd has a wave form as illustrated in FIG. 3, the current detection signal Sb has a wave form as illustrated in FIG. 3. Incidentally, a symbol of "Tp" illustrates a pulse period of the PWM drive signal Sd. The A/D converter 13 sets the time when the PWM drive signal Sd switches from OFF to ON as a reference fetch start timing ts0. The reference fetch start timing ts0 is coincident with the timing of the driving period of the inductive load 2. The A/D converter 13 takes in (captures) the current detection value I from the reference fetch start timing ts0 each predetermined first sampling period T1. The fetch timings of the current detection value I are set so as to be shifted from the reference fetch start timing ts0 each first sampling period T1. The fetch timings of the current detection value I are set so as to be present each first sampling period T1, starting from the reference fetch start timing ts0. Thus, the A/D converter 13 takes in the current detection values I as illustrated with a circle in FIG. 3. The first sampling period T1 is beforehand set up by an experiment or the like, and the accuracy of the current control of the inductive load 2 can be assured. In the present embodiment, as an example, the first sampling period T1 is set up so that 16 points of current detection values Ia1-Ia16 can be obtained during a single pulse period Tp of the PWM drive signal Sd. When the A/D converter 13 obtains 16 points of the current detection values Ia1-Ia16 from the reference fetch start timing ts0, the microcomputer 10 calculates the average value (corresponding to the average current value Iave) of the current detection values Ia1-Ia16 and sets the calculated average current value Iave as the ideal value Ii.

An acquisition method of the sample data values Is(1)-Is(n) of the average current value Iave with the microcomputer 10 will be explained.

The microcomputer 10 sets as a fetch start timing ts, the time which is shifted from the reference fetch start timing ts0 by a predetermined time delay td. The microcomputer 10 changes the sampling period of the A/D converter 13 into the second sampling period T2 from the first sampling period T1. The fetch timings of the current detection value I are set up so as to be shifted from the fetch start timing ts each second sampling period T2 as described in FIG. 4. The fetch timings of the current detection value I are set up so as to be present each second sampling period T2, starting from the fetch start timing ts.

Figure 4:
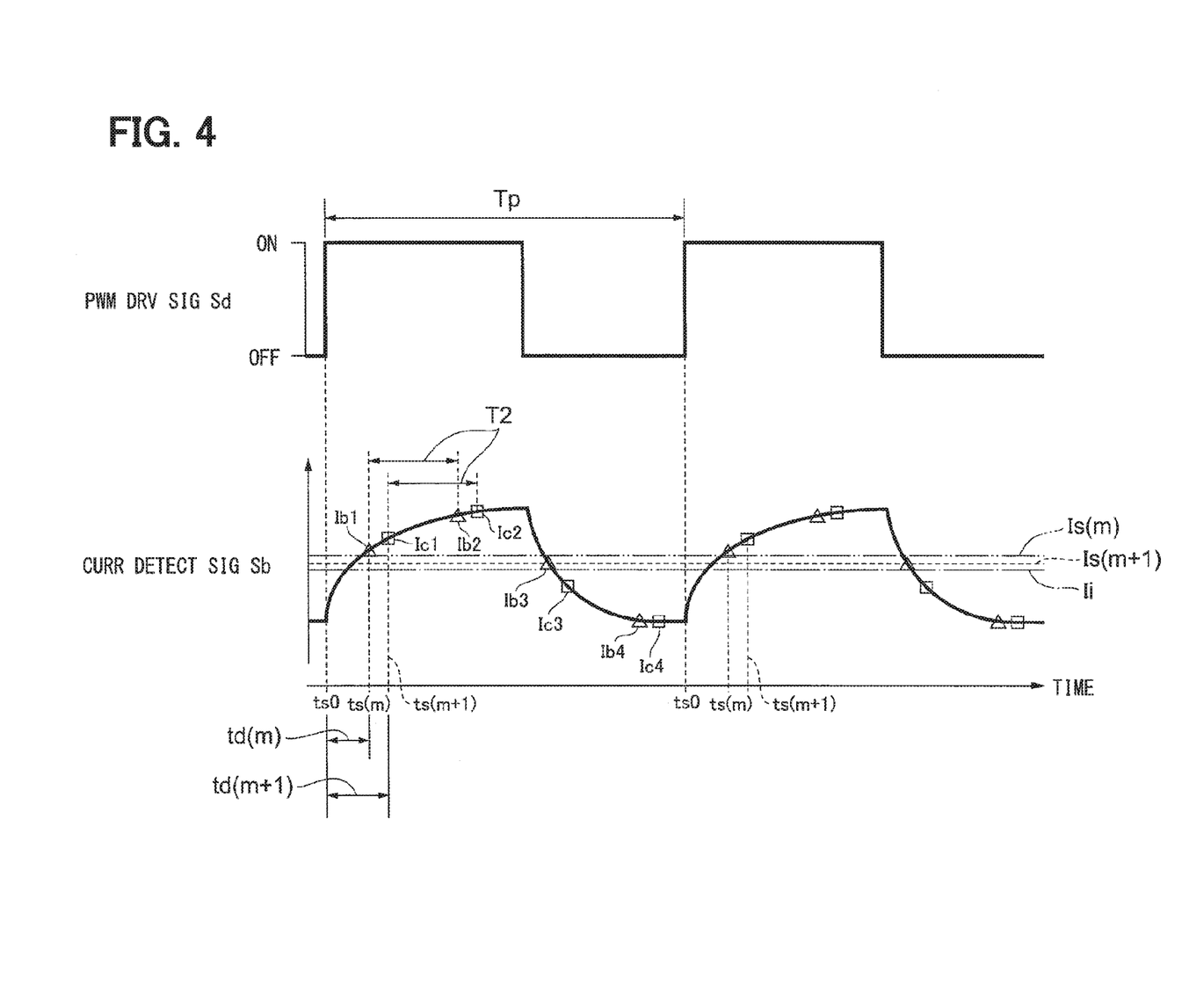
FIG. 4 is a timing chart illustrating changes of a PWM drive signal Sd and a current detection signal Sb.

Incidentally, the second sampling period T2 is set longer than the first sampling period T1. In the present embodiment, the second sampling period T2 is set so that four points of the current detection values I are obtained during a single pulse period Tp of the PWM drive signal Sd.

Multiple time delays td are set corresponding to multiple time delays td(1)-Td(n). That is, corresponding to the number of the time delays td(1)-td(n), the fetch start timings ts are also set as multiple fetch start timings ts(1)-ts(n). Incidentally, "n" represents two or more integers. Times td(1)-td(n) are set so as to be "td(1)<td(2)< . . . <td(n). The microcomputer 10 calculates the sample data values Is(1)-Is(n) of the average current value Iave, which correspond to the fetch start timings ts(1)-ts(n), respectively.

FIG. 4 exemplifies the fetch start timing ts(m) corresponding to the time delay td(m) and the fetch start timing ts(m+1) corresponding to the time delay td(m+1) among the multiple time delays td(1)-td(n) and the multiple fetch start timings ts(1)-ts(n).

For example, as described with a triangle mark in FIG. 4, when the A/D converter 13 obtains the four points of the current detection values Ib1-Ib4 from the fetch start timing ts(m), the microcomputer 10 calculates an average value of the current detection values Ib1-Ib4. Accordingly, the microcomputer 10 obtains the sample data value Is(m) of the average current value Iave, which corresponds to the fetch start timing ts(m).

For example, as described with a square mark in FIG. 4, when the A/D converter 13 obtains the four points of the current detection values Ic1-Ic4 from the fetch start timing ts(m+1), the microcomputer 10 calculates an average value of the current detection values Ic1-Ic4. Accordingly, the microcomputer 10 obtains the sample data value Is(m+1) of the average current value Iave, which corresponds to the fetch start timing ts(m+1).

Figure 5:
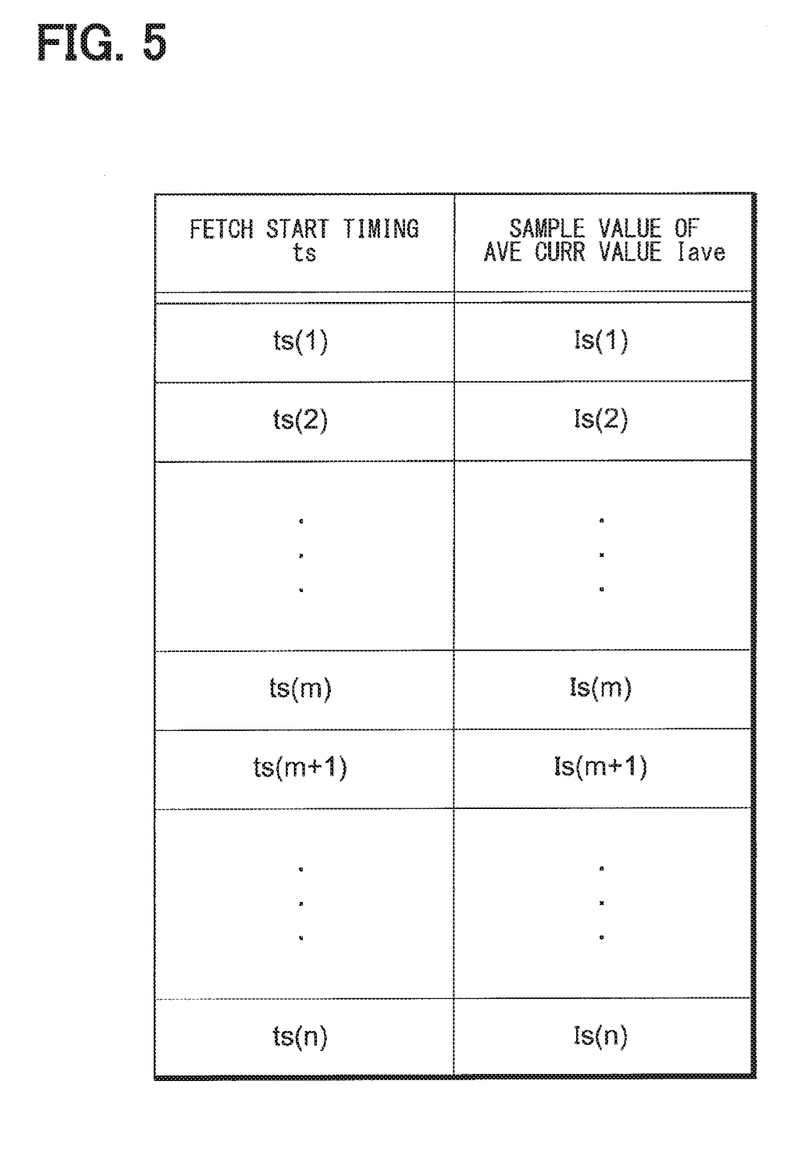
FIG. 5 is a diagram illustrating a connection between a fetch start timing ts and a sample data value of an average current value Iave.

The microcomputer 10 performs the similar calculations for each of multiple fetch start timings ts(1)-ts(n). As described in FIG. 5, the microcomputer 10 obtains sample data values Is(1)-Is(n) of the average current value Iave. Incidentally, the multiple fetch start timings ts(1)-ts(n) correspond to the multiple sample data values Is(1)-Is(n), respectively.

The setting method of the fetch start timing of the A/D converter 13 with the microcomputer 10 will be explained.

It is supposed that the microcomputer 10 obtains the ideal value Ii of the average current value Iave and the sample data values Is(1)-Is(n) of the average current value Iave, respectively corresponding to the fetch start timing ts(1)-ts(n). In this case, the microcomputer 10 calculates deflections between each of the sample data values Is(1)-Is(n) of the average current value Iave and the ideal value Ii of the average current value Iave. The microcomputer 10 stores a fetch start timing ts corresponding to a sample data value of the average current value Iave as a learning value, the deflection between the sample data value and the ideal value Ii corresponding to the stored fetch start timing being the least deflection among the calculated deflections. In other words, the microcomputer 10 stores the learning value, causing the deflection between the sample data value of the average current value Iave and the ideal value Ii to be minimized. The microcomputer 10 may compare the calculated deflections to find the least deflection, and may find a sample data value corresponding to the least deflection, for example. The A/D converter 13 takes in the current detection value I with the learning value of the fetch start timing ts, so that it may be possible to approach the average current value Iave calculated at the time when the second sampling period T2 is used as the sampling period of the A/D converter 13 to the calculated value of the average current value Iave calculated at the time when the first sampling period T1 is used as the sampling period of the A/D converter 13. That is, even when the sampling period of the A/D converter 13 is set to the second sampling period T2, it may be possible to assure an operational accuracy of the average current value Iave.

After completing the learning of the fetch start timing ts, while using the learning value of the fetch start timing ts in execution of current control of the inductive load 2, the microcomputer 10 takes in the current detection value I of the A/D converter 13 at the second sampling period T2. The microcomputer 10 calculates the average current values Iave based on the correct detection value I obtained by the A/D converter 13, and executes the current control of the inductive load 2.

A procedure of an arithmetic processing of the average current value Iave and the learning processing of the fetch start timing ts, executed by the microcomputer 10, will be explained.

Figure 6:
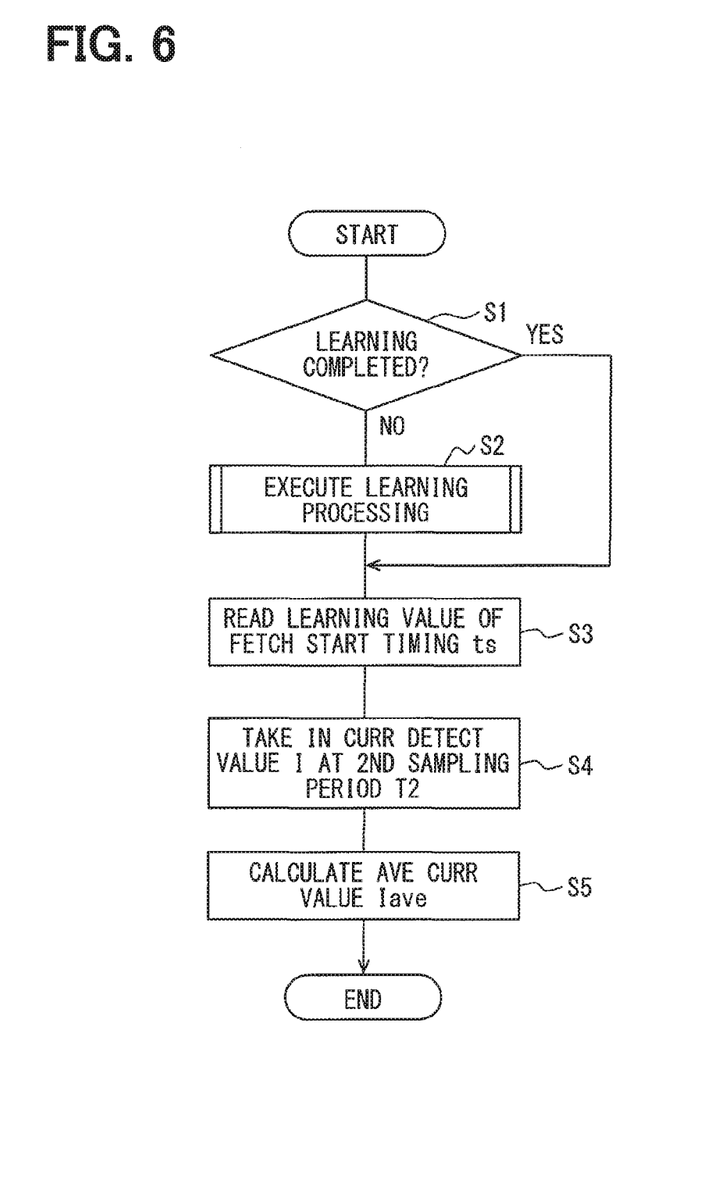
FIG. 6 is a flowchart illustrating a procedure which is executed by the electronic control apparatus of the present embodiment.

The microcomputer 10 repeatedly performs processing of FIG. 6 with a predetermined arithmetic period after an ignition switch of a vehicle receives an ON operation. It is determined at S1 whether the microcomputer 10 has completed the learning processing. The learning processing is not completed immediately after performing the ON operation of the ignition switch. In this case, the microcomputer 10 determines that the learning processing has not been completed (S1: NO), and the microcomputer 10 executes the learning processing illustrated in FIG. 7 (S2).

Figure 7:
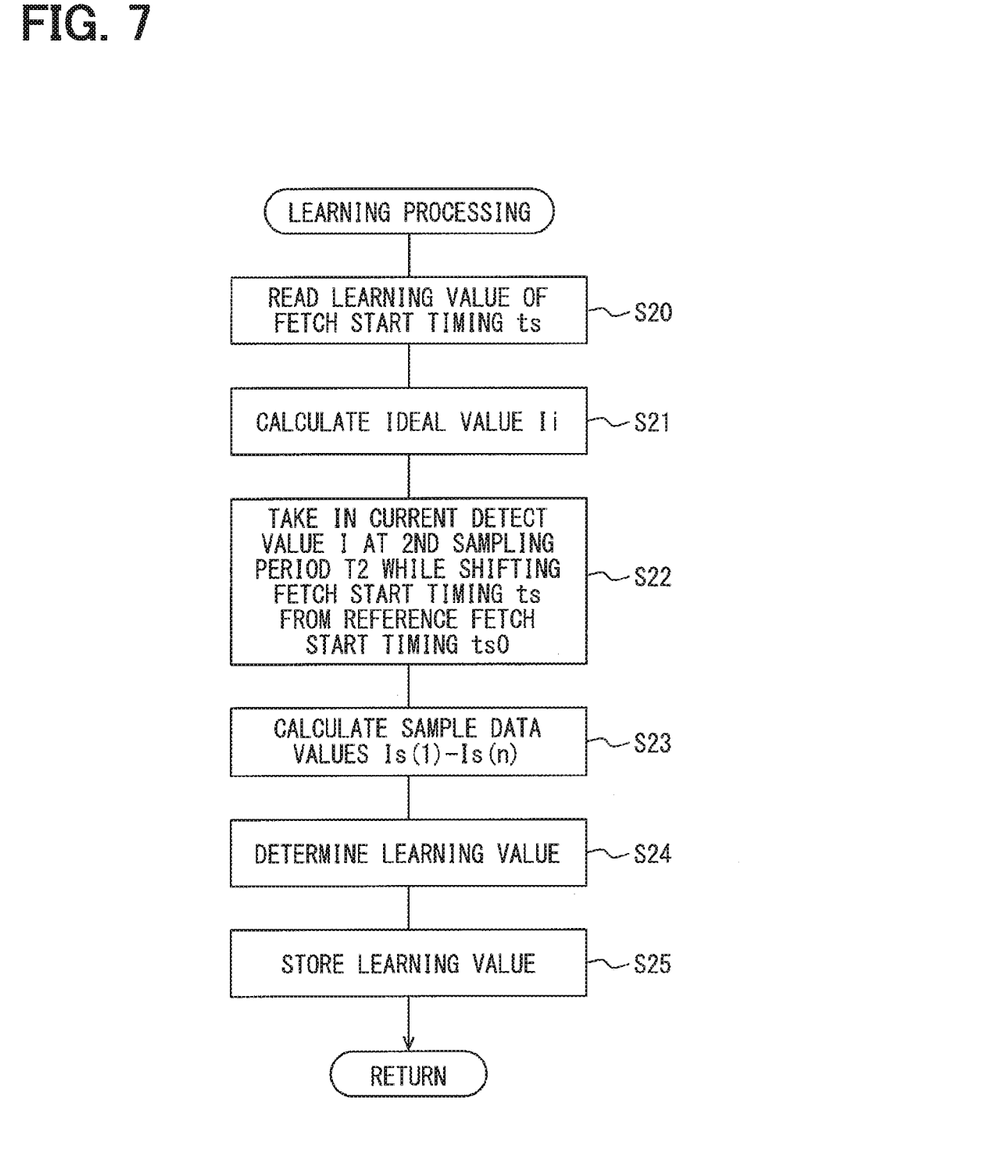
FIG. 7 is a flowchart illustrating a procedure of a learning processing executed by the electronic control apparatus of the present embodiment.

As illustrated in FIG. 7, in the learning processing, the microcomputer 10 takes in the current detection value I at the first sampling period T1 (S20), and then calculates the ideal value Ii of the average current value Iave based on the current detection value I, which is taken in (S21). After S21, the microcomputer 10 takes in the current detection values I at the second sampling period T2 while the fetch start timing ts of the A/D converter 13 is shifted from the reference fetch start timing ts0 by a predetermined time delay td (S22). At S22, the microcomputer 10 sets up the time delay td to multiple times td(1)-td(n), so that the microcomputer 10 takes in the corresponding current detection value I that corresponds to each of the multiple fetch start timings ts(1)-ts(n).

After S22, the microcomputer 10 calculates the sample data values Is(1)-Is(n) of the average current value Iave respectively corresponding to the multiple fetch start timings ts(1)-ts(n), based on the current detection value I, which is taken in (S23).

After S23, the microcomputer 10 determines a sample data value of the average current value Iave with the least deflection to the ideal value Ii among the sample data values Is(1)-Is(n) of the average current value Iave. And then, the microcomputer 10 determines a fetch start timing ts corresponding to the sample data value as the learning value (S24). Also, the microcomputer 10 determines the learning value of the fetch start timing ts. The microcomputer 10 stores the learning value of the start timing ts into the memory 11 (S25).

The microcomputer 10 reads the learning value of the fetch start timing ts as described in FIG. 6 from the memory 11 after the learning processing of FIG. 7 has been completed (S3). The microcomputer 10 reads the current detection value I at the second sampling period T2 (S4). The microcomputer 10 calculates the average current value Iave based on the current detection value I (S5). Accordingly, the microcomputer 10 executes the current control of the inductive load 2. The microcomputer 10 learns the fetch start timing ts of the A/D converter 13 before executing the current control of the inductive load 2.

After the learning processing has been completed once, the microcomputer 10 determines at S1 that the learning processing has completed (S1: YES). And the microcomputer 10 performs the processing of S3-S5, and continues the current control of the inductive load 2.

According to the electronic control apparatus 1 of the present embodiment, the following effect and advantage may be obtained.

(1) When the current control of the inductive load 2 is executed, the A/D converter 13 takes in the current detection value I at the second sampling period T2. As compared with a case where the current detection value I is taken in at the first sampling period T1, it may be possible to reduce a processing load on the microcomputer 10 since the number of times of sampling of the current detection value I is reduced. By learning the fetch start timing ts of the A/D converter 13, even when the number of times of sampling of the current detection value I of the A/D converter 13 is reduced, it may be possible to approach the operational accuracy of the current detection value I to an operational accuracy in a case where the current detection value I is detected at the first sampling period T1. Therefore, while reducing the processing load on the microcomputer 10, it may be possible to assure the precision of the current control of the inductive load 2.

(2) The microcomputer 10 uses the first sampling period T1 as a sampling period of the current detection value I when the microcomputer 10 calculates the ideal value Ii of the average current value Iave. In addition, when the microcomputer 10 calculates the sample data values Is(1)-Is(n) of the average current value Iave, or when the microcomputer 10 calculates the average current value Iave used in the current control of the inductive load 2, the microcomputer 10 uses the second sampling period T2 as the sampling period of the current detection value I, the second sampling period T2 being longer than the first sampling period T1. Accordingly, it may be possible to easily set the fetch timing of the current detection value I.

(3) The microcomputer 10 learns the fetch start timing ts of the A/D converter 13 before execution of the current control of the inductive load 2. Accordingly, it may be possible to remove influence of the learning processing to the execution of the current control of the microcomputer 10. It may be possible to prevent the learning processing from affect the execution of the current control of the microcomputer 10.

Incidentally, an embodiment of the present disclosure may be implemented by the following modes, for example.

Figure 8:
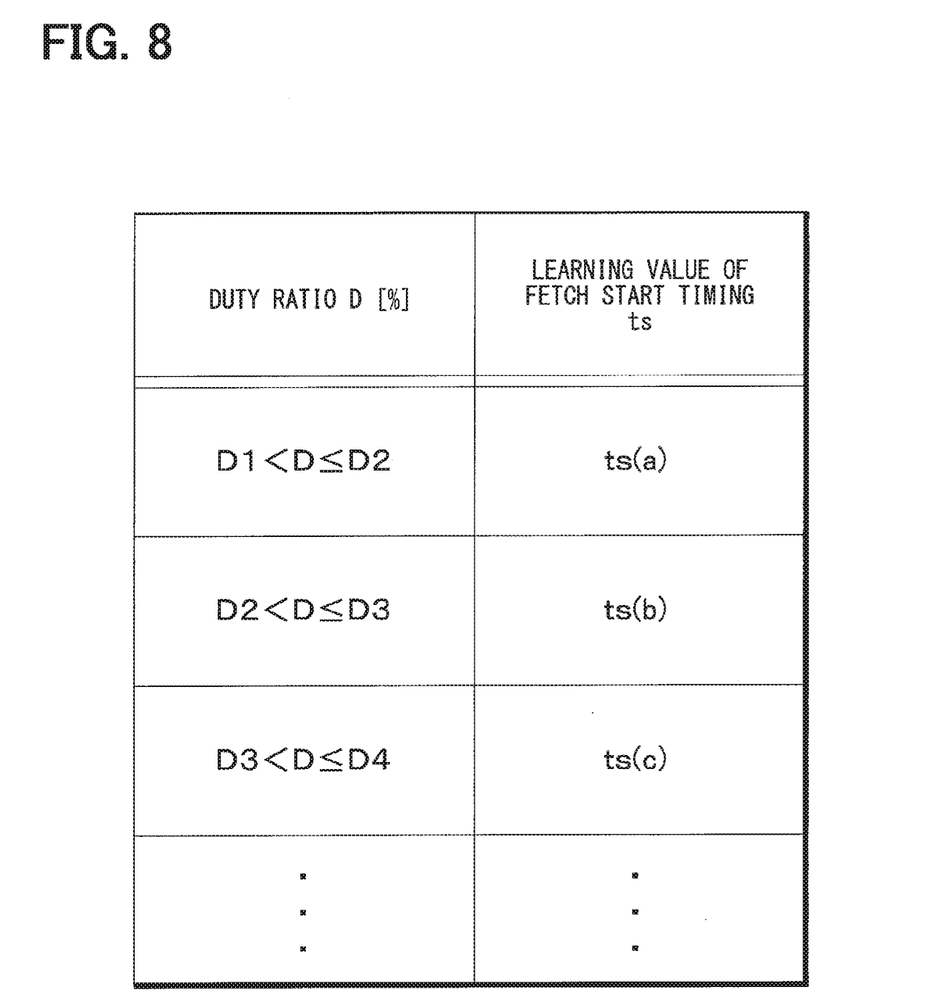
FIG. 8 is a diagram illustrating a connection between a duty ratio D and a learning value of a fetch start timing ts in another embodiment of the present disclosure.

The microcomputer 10 may learn the fetch start timing ts in each of multiple areas set in the duty ratio D. Specifically, as described in FIG. 8, multiple areas are set for the duty ratio D. FIG. 8 exemplifies three areas among the multiple areas set in the duty ratio D. In this example, three areas of the duty ratio includes: $D1<D≤D2$; $D2<D≤D3$; and $D3<D≤D4$. Incidentally, D1, D2, D3, and D4 are predetermined values, and D1, D2, D3, and D4 have the following relation: $D1<D2<D3<D4$.

For example, the microcomputer 10 may learn the fetch start timing ts regarding a case where the duty ratio D is set to a predetermined value of $((D1+D2)/2)$, and may store the learning value of the fetch start timing ts as a fetch start timing ts(a) of the area of "$D1<D≤D2$", to the memory 11. Similarly, the microcomputer 10 may learn a fetch start timing ts(b) at the time when the duty ratio D is set to "$D2<D≤D3$", and a fetch start timing ts(c) at the time when the duty ratio D is set to "D3<D≤D4". Accordingly, the microcomputer 10 learns the fetch start timing ts for each of the multiple areas set based on the duty ratio D.

According to the configuration, since the fetch start timing ts is set to a more suitable value according to the duty ratio D, it may be possible to improve the operational accuracy of the current detection value I. Therefore, it may be possible to improve the accuracy of the current control of the inductive load 2.

The microcomputer 10 may use another arithmetic value other than the average value Iave, as an arithmetic value of the current detection value I. In this case, as a method to obtain the arithmetic value of the current detection value I, any method based on the above embodiment may be adopted.

The semiconductor switch 20 may be any suitable switching element such as a bipolar transistor.

The lengths of the first sampling period T1 and the second sampling period T2 may be changed appropriately.

The microcomputer 10 may use the target current value I* as the ideal value Ii of the average current value Iave.

It is noted that a flowchart or the process of the flowchart in the present application includes steps (also referred to as sections), each of which is represented, for instance, as S1. Further, each step can be divided into several sub-steps while several steps can be combined into a single step.

While the embodiments, the configurations, the aspects of the electronic control apparatus have been described by way of example, it should be appreciated that embodiments, configurations, aspects of the present disclosure are not limited to the respective embodiments, the respective configurations, and the respective aspects described above. For example, embodiments, configurations, aspects obtained by appropriately combining technical portions disclosed in different embodiments, configurations, and aspects are included within a range of embodiments, configurations, and aspects of the present disclosure.

What is claimed is:

1. An electronic control apparatus that controls actuation of an inductive load, comprising:
   a current detector that detects current flowing through the inductive load and outputs a current detection signal according to a value of the detected current, the current detection signal being an analog signal;
   an analog-digital converter that takes in the current detection signal from the current detector at a predetermined fetch timing, and converts the current detection signal into a digital current detection value; and
   a controller that calculates a current arithmetic value by executing a predetermined arithmetic processing for the digital current detection value, and controls the current flowing through the inductive load based on the current arithmetic value, the controller including a learning portion that learns the fetch timing of the current detection signal,
   wherein:
   the learning portion, by obtaining the current arithmetic value while changing the fetch timing, obtains a sample data value of the current arithmetic value for each of a plurality of fetch timings; and
   the learning portion calculates a deflection between an ideal value of the current arithmetic value and the sample data value of the current arithmetic value for each of the plurality of fetch timings, and learns the fetch timing of the analog-digital converter, causing the deflection with the ideal value of the current arithmetic value to be minimized.

2. The electronic control apparatus according to claim 1, wherein:
   a fetch start timing represents timing of actuation period of the inductive load; and
   the fetch timing is set so as to be shifted by a predetermined sampling period from the fetch start timing.

3. The electronic control apparatus according to claim 2, wherein:
   the predetermined sampling period includes a first sampling period and a second sampling period which is longer than the first sampling period;
   when the ideal value of the current arithmetic value is calculated, the controller adopts the first sampling period as the predetermined sampling period of the current detector; and
   when the sample data values of the current arithmetic value is calculated, or when the current arithmetic value for current control of the inductive load is calculated, the controller adopts the second sampling period as the predetermined sampling period of the current detector.

4. The electronic control apparatus according to claim 1, wherein:
   the ideal value is equal to a target current value which is a target value of the current flowing through the inductive load.

5. The electronic control apparatus according to claim 1, wherein:
   before the controller executes current control of the inductive load, the controller learns the fetch start timing of the analog-digital converter.

6. The electronic control apparatus according to claim 1, wherein:
   the controller calculates an average value of current detection values as the arithmetic processing.

7. The electronic control apparatus according to claim 1, wherein:
   the controller calculates a duty ratio by execution of a current feedback control that causes the current arithmetic value to follow a target current value;
   the controller generates a pulse-width modulation drive signal based on the duty ratio;
   the controller executes a pulse-width modulation control for the current flowing through the inductive load by controlling actuation of a switching element based on the pulse-width modulation drive signal; and
   the fetch timing of the analog-digital converter is set to a plurality of areas which are set to the duty ratio.

* * * * *